(12) United States Patent
Lin et al.

(10) Patent No.: US 11,690,223 B2
(45) Date of Patent: Jun. 27, 2023

(54) 3D MEMORY DEVICE AND MANUFACTURING METHOD THEREOF

(71) Applicant: MACRONIX International Co., Ltd., Hsinchu (TW)

(72) Inventors: Chung Yi Lin, Hsinchu County (TW); Chih-Hsiung Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 313 days.

(21) Appl. No.: 17/160,066

(22) Filed: Jan. 27, 2021

(65) Prior Publication Data

US 2022/0238549 A1 Jul. 28, 2022

(51) Int. Cl.
*H01L 21/00* (2006.01)
*H10B 43/27* (2023.01)
*H10B 43/10* (2023.01)
*H10B 43/30* (2023.01)

(52) U.S. Cl.
CPC ............ *H10B 43/27* (2023.02); *H10B 43/10* (2023.02); *H10B 43/30* (2023.02)

(58) Field of Classification Search
CPC ......... H10B 43/27; H10B 43/30; H10B 43/10
See application file for complete search history.

(56) References Cited

U.S. PATENT DOCUMENTS

| | | | | |
|---|---|---|---|---|
| 9,281,316 B2 * | 3/2016 | Lee | ........................ | H01L 21/486 |
| 9,293,172 B2 * | 3/2016 | Lee | ........................ | H10B 43/40 |
| 9,299,718 B2 * | 3/2016 | Park | ........................ | H10B 43/35 |
| 2020/0091156 A1 | 3/2020 | Sharma et al. | | |
| 2022/0238549 A1 * | 7/2022 | Lin | ........................ | H01L 28/90 |

OTHER PUBLICATIONS

"Office Action of Taiwan Counterpart Application", dated Jul. 29, 2021, p. 1-p. 5.

* cited by examiner

*Primary Examiner* — Richard A Booth
(74) *Attorney, Agent, or Firm* — J.C. Patents (57) ABSTRACT

Provided are a three-dimensional (3D) memory device and a manufacturing method thereof. The 3D memory device includes a gate stacked structure, a channel layer, a charge storage structure, an electrode layer and a capacitor dielectric layer. The gate stacked structure is disposed on a substrate and includes a plurality of gate layers electrically insulated from each other. The gate stacked structure has at least one channel hole and at least one capacitor trench. The channel layer is disposed on the sidewall of the at least one channel hole. The charge storage structure is disposed between the channel layer and the sidewall of the at least one channel hole. The electrode layer is disposed on the sidewall of the at least one capacitor trench. The capacitor dielectric layer is disposed between the electrode layer and the sidewall of the at least one capacitor trench.

9 Claims, 8 Drawing Sheets

3D MEMORY DEVICE AND MANUFACTURING METHOD THEREOF

BACKGROUND

Technical Field

The invention relates to a memory device and a manufacturing method thereof, and more particularly to a three-dimensional (3D) memory device with a trench capacitor and a manufacturing method thereof.

Description of Related Art

A non-volatile memory (such as a flash memory) has the advantage that the stored data will not disappear after power off, so it has become a kind of memory widely used in personal computers and other electronic apparatuses.

A general memory devices usually includes a memory array and a capacitor, and the capacitor is disposed in a peripheral region adjacent to a memory array region. However, the layout described above requires a larger layout area, and thus the size of the memory device cannot be reduced.

SUMMARY

The present invention provides a three dimensional memory device, wherein the trench capacitor is arranged in a gate stacked structure.

The present invention provides a method for manufacturing a three dimensional memory device, in which a trench capacitor is formed in a gate stacked structure.

A three dimensional memory device of the present invention includes a gate stacked structure, a channel layer, a charge storage structure, an electrode layer and a capacitor dielectric layer. The gate stacked structure is disposed on a substrate and includes a plurality of gate layers electrically insulated from each other. The gate stacked structure has at least one channel hole and at least one capacitor trench. The channel layer is disposed on the sidewall of the at least one channel hole. The charge storage structure is disposed between the channel layer and the sidewall of the at least one channel hole. The electrode layer is disposed on the sidewall of the at least one capacitor trench. The capacitor dielectric layer is disposed between the electrode layer and the sidewall of the at least one capacitor trench.

In an embodiment of the three dimensional memory device of the present invention, a circumference of an opening of the capacitor trench is at least 34 times a circumference of an opening of the channel hole when viewed from a top view above the substrate.

In an embodiment of the three dimensional memory device of the present invention, the material of the channel layer is the same as the material of the electrode layer.

In an embodiment of the three dimensional memory device of the present invention, the channel layer and the electrode layer include polysilicon layers.

In an embodiment of the three dimensional memory device of the present invention, the material of the charge storage structure is the same as the material of the capacitor dielectric layer.

In an embodiment of the three dimensional memory device of the present invention, the charge storage structure and the capacitor dielectric layer include a composite layer composed of oxide layer/nitride layer/oxide layer.

In an embodiment of the three dimensional memory device of the present invention, one end of the channel layer is electrically connected to a bit line, and the other end of the channel layer is electrically connected to a source line.

In an embodiment of the three dimensional memory device of the present invention, the gate stacked structure has a plurality of the channel holes, and the channel holes surround the at least one capacitor trench.

In an embodiment of the three dimensional memory device of the present invention, the three dimensional memory device further includes an insulating layer filling the at least one channel hole and the at least one capacitor trench.

A manufacturing method of a three dimensional memory device of the present invention includes the following steps. A gate stacked structure including a plurality of gate layers electrically insulated from each other on the substrate is formed. At least one channel hole and at least one capacitor trench are formed in the gate stacked structure. A first material layer is formed on the sidewall of the at least one channel hole to act as a charge storage structure and on the sidewall of the at least one capacitor trench to act as a capacitor dielectric layer. A second material layer is formed on the charge storage structure to act as a channel layer and on the capacitor dielectric layer to act as an electrode layer.

In an embodiment of the manufacturing method of the present invention, a circumference of an opening of the capacitor trench is at least 34 times a circumference of an opening of the channel hole when viewed from a top view above the substrate.

In an embodiment of the manufacturing method of the present invention, the first material layer includes a composite layer composed of oxide layer/nitride layer/oxide layer.

In an embodiment of the manufacturing method of the present invention, the second material layer includes a polysilicon layer.

In an embodiment of the manufacturing method of the present invention, the method further includes a step of forming a bit line electrically connected to one end of the channel layer and forming an source line electrically connected to the other end of the channel layer.

In an embodiment of the manufacturing method of the present invention, a plurality of the channel holes are formed in the gate stacked structure, and the channel holes surround the at least one capacitor trench.

In an embodiment of the manufacturing method of the present invention, the method further includes a step of forming an insulating layer to fill the at least one channel hole and the at least one capacitor trench after forming the second material layer.

Based on the above, in the three dimensional memory device of the present invention, the capacitor is disposed in the gate stacked structure in the memory array region instead of the peripheral region. Therefore, the layout area of the three dimensional memory device may be reduced, and thus the size of the three dimensional memory device may be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The embodiments are described in detail below with reference to the accompanying drawings, but the embodiments are not intended to limit the scope of the present disclosure. In addition, the drawings are for illustrative purposes only and are not drawn to the original dimensions. For the sake of easy understanding, the same elements in the following description will be denoted by the same reference numerals.

In addition, the terms mentioned in the text, such as "comprising", "including" and "having" are all open-ended terms, i.e., meaning "including but not limited to".

In addition, the directional terms mentioned in the text, such as "on" and "under", are merely used to refer to the drawings and are not intended to limit the present invention.

When using terms such as "first" and "second" to describe a device, it is only used to distinguish the devices from each other, and does not limit the order or importance of the devices. Therefore, in some cases, the first device can also be called the second device, the second device can also be called the first device, and this is not beyond the scope of the present invention.

Figure 1A:
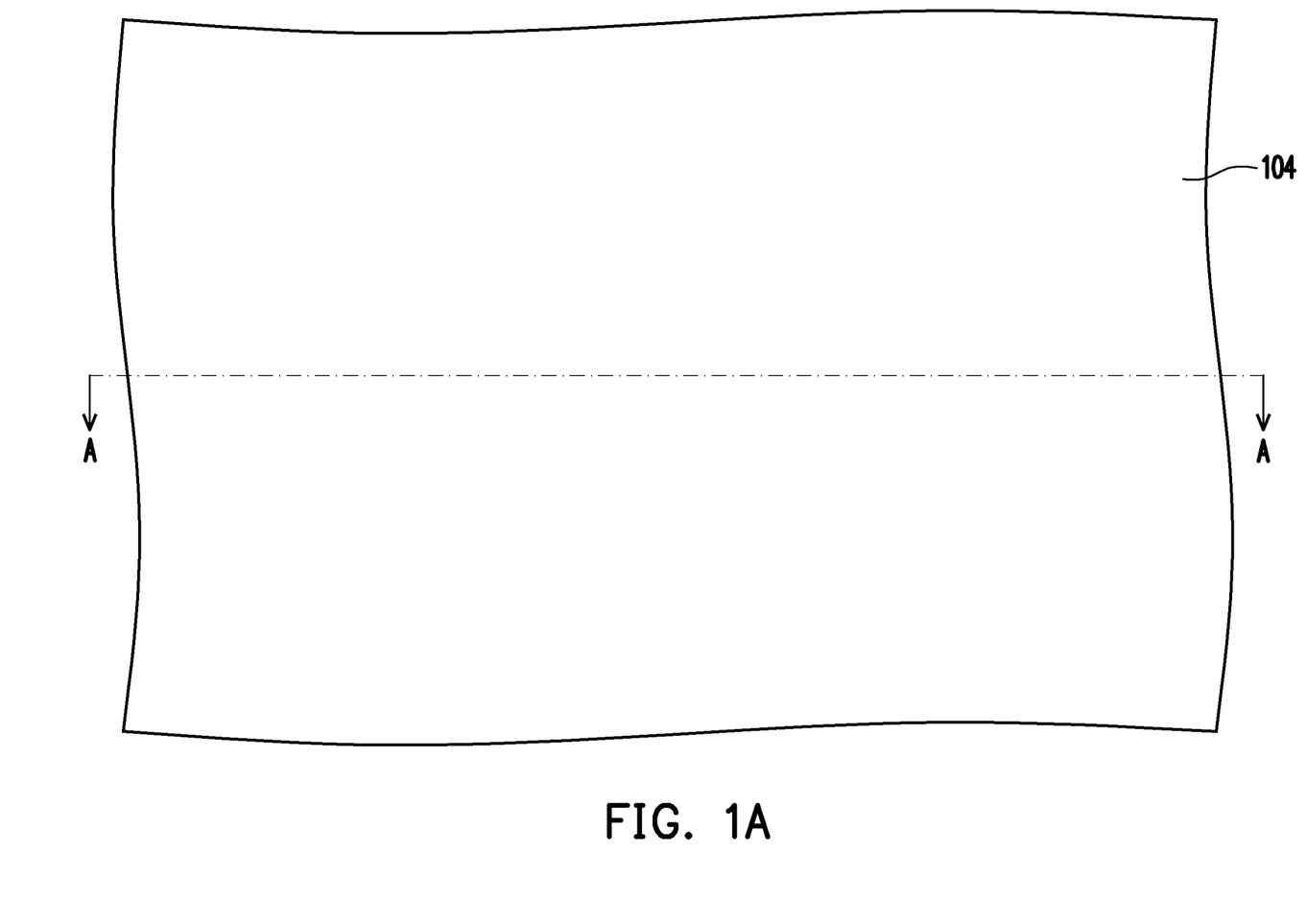
FIGS. 1A to 1C are schematic top views of a manufacturing process of a 3D memory device according to an embodiment of the present invention.
Figure 1B:
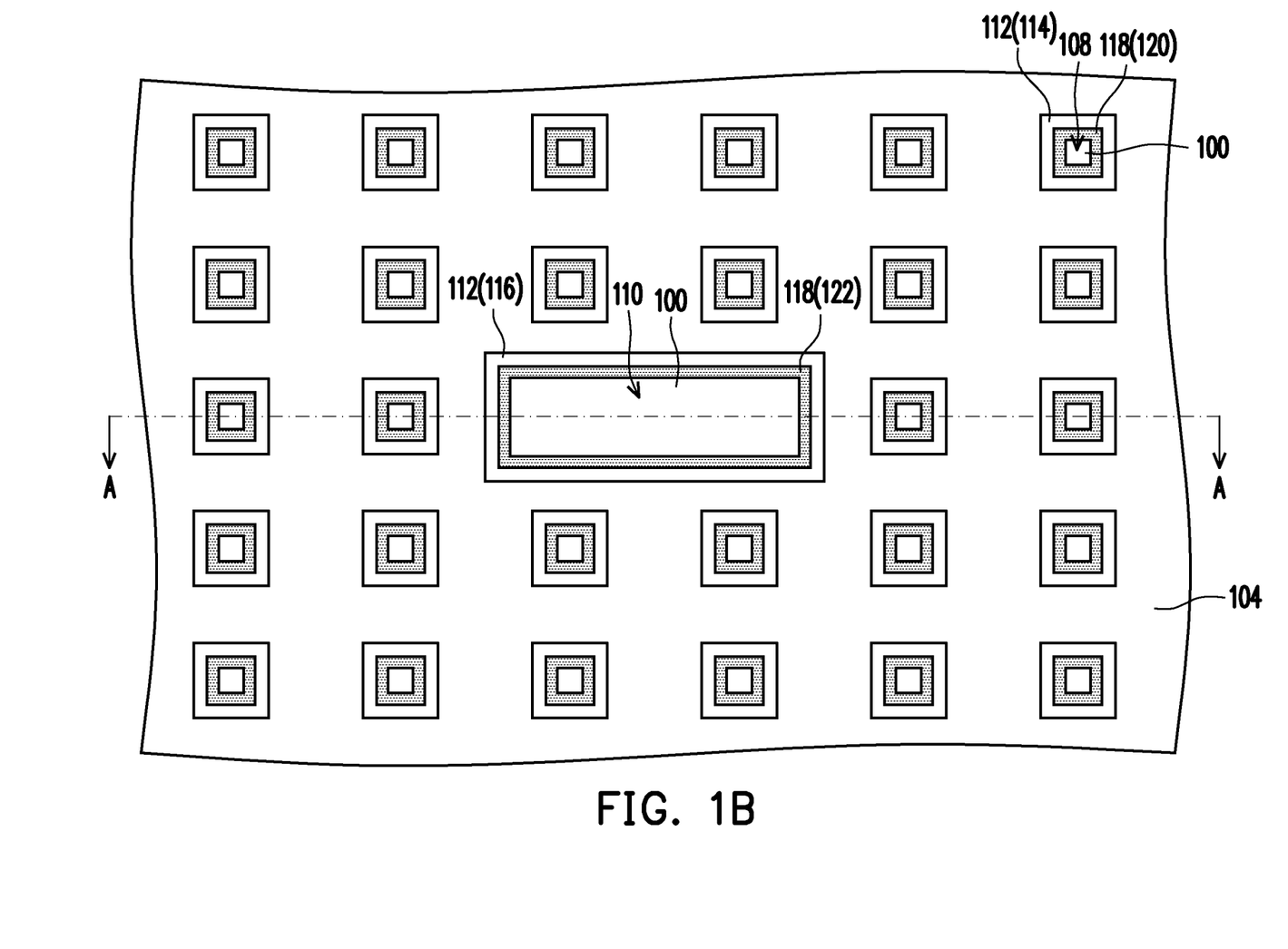
Figure 1C:
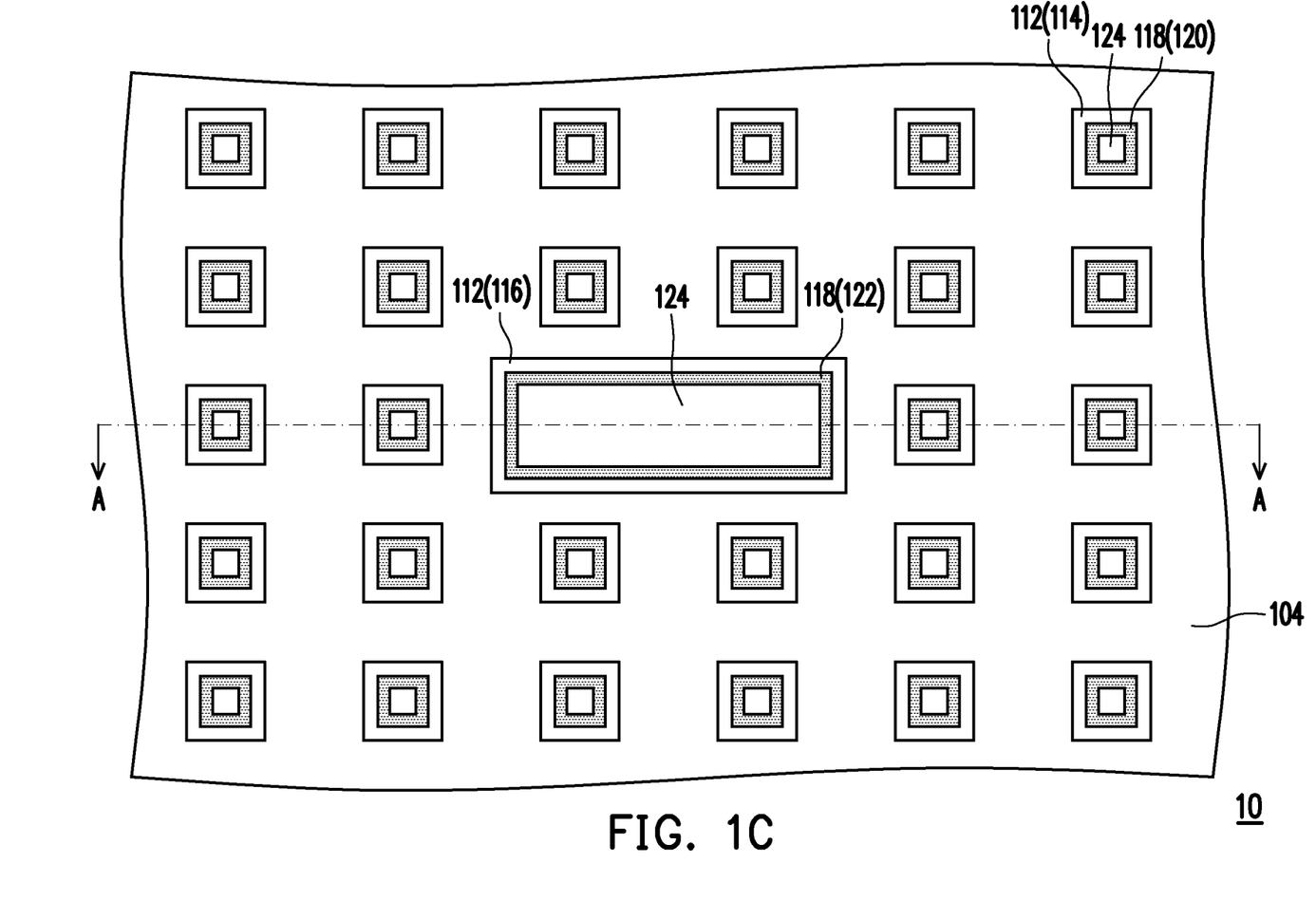
Figure 2A:
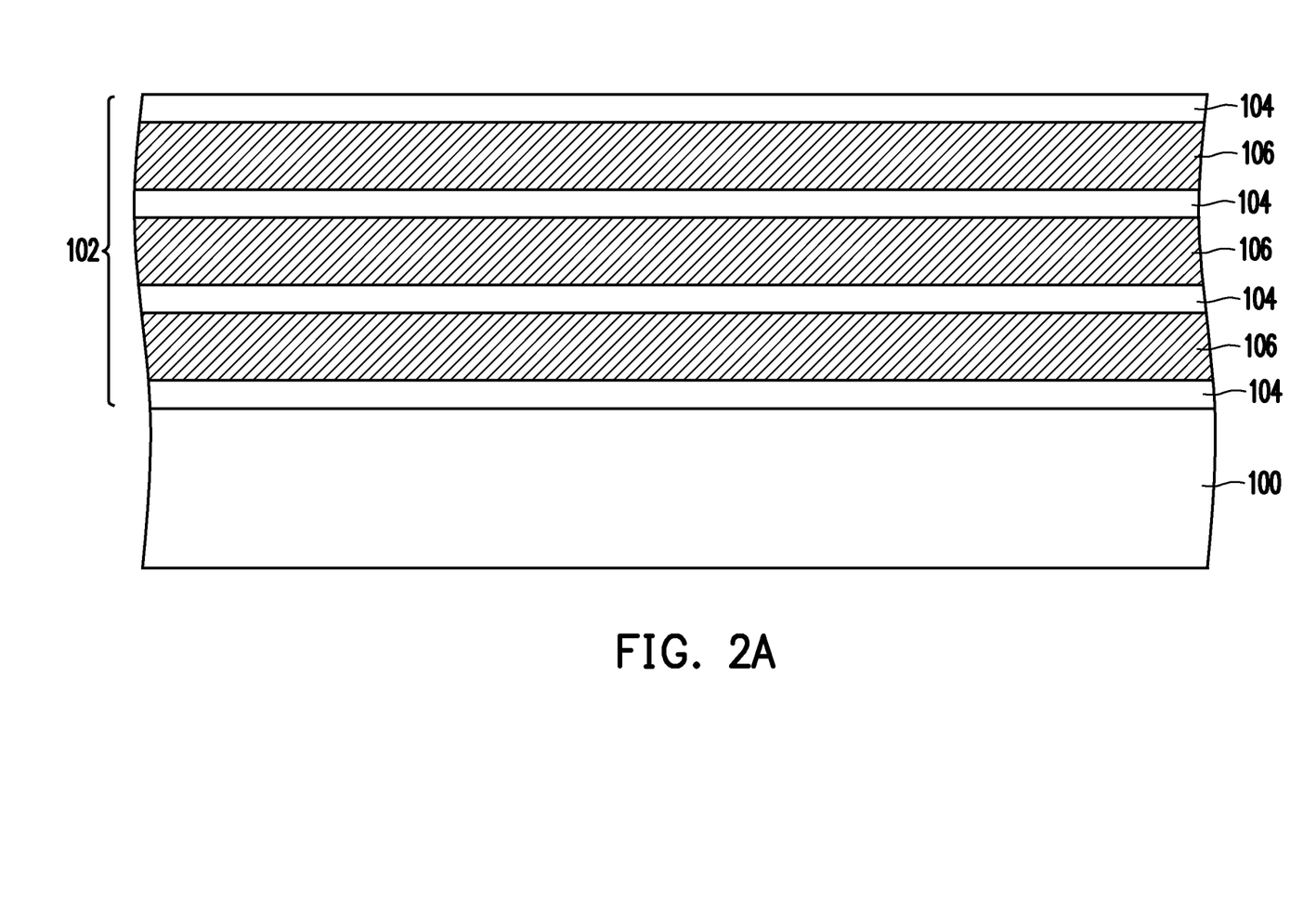
FIGS. 2A to 2C are schematic cross-sectional views of the manufacturing process of the 3D memory device according to the A-A section line in FIGS. 1A to 1C.
Figure 2B:
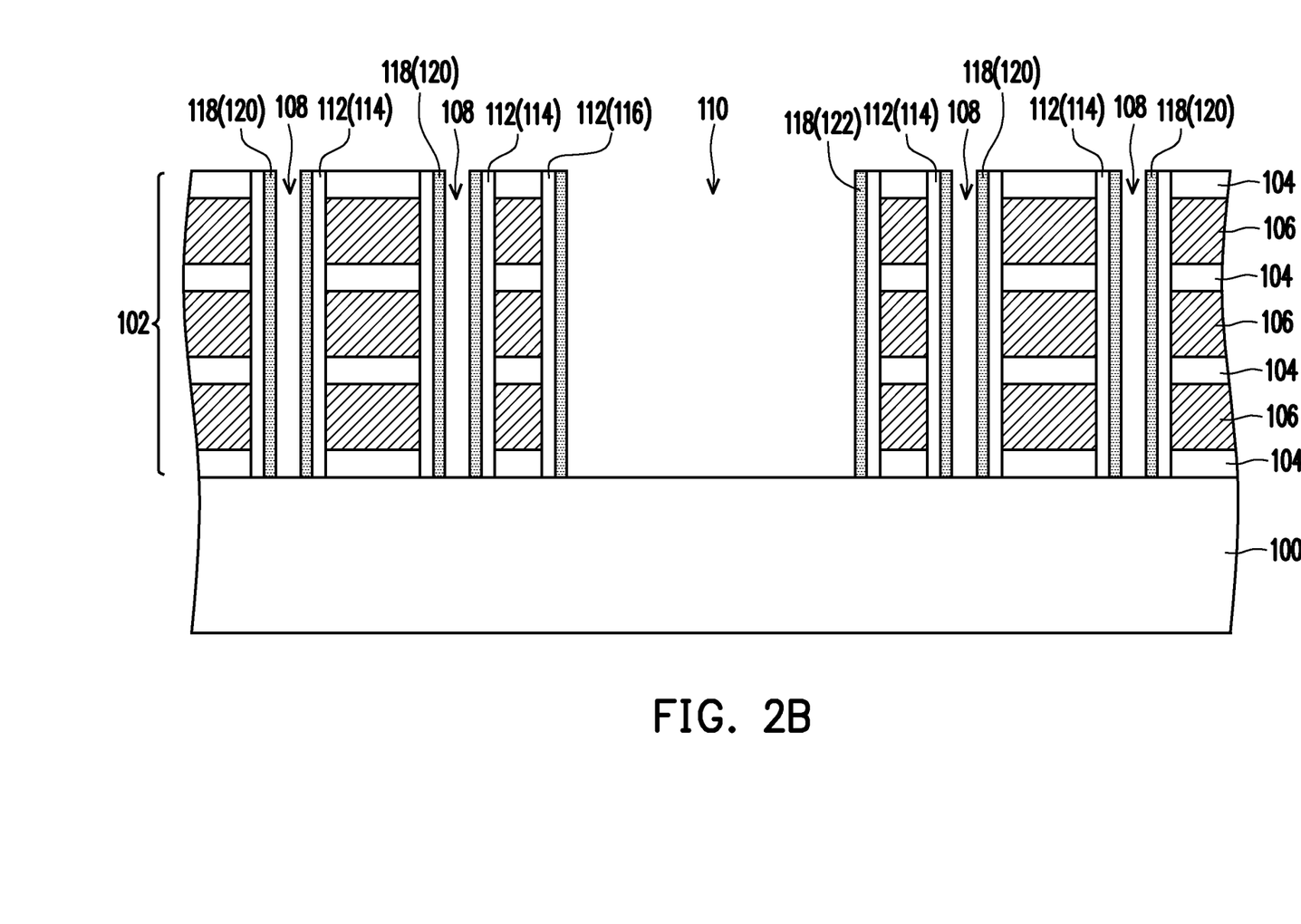
Figure 2C:
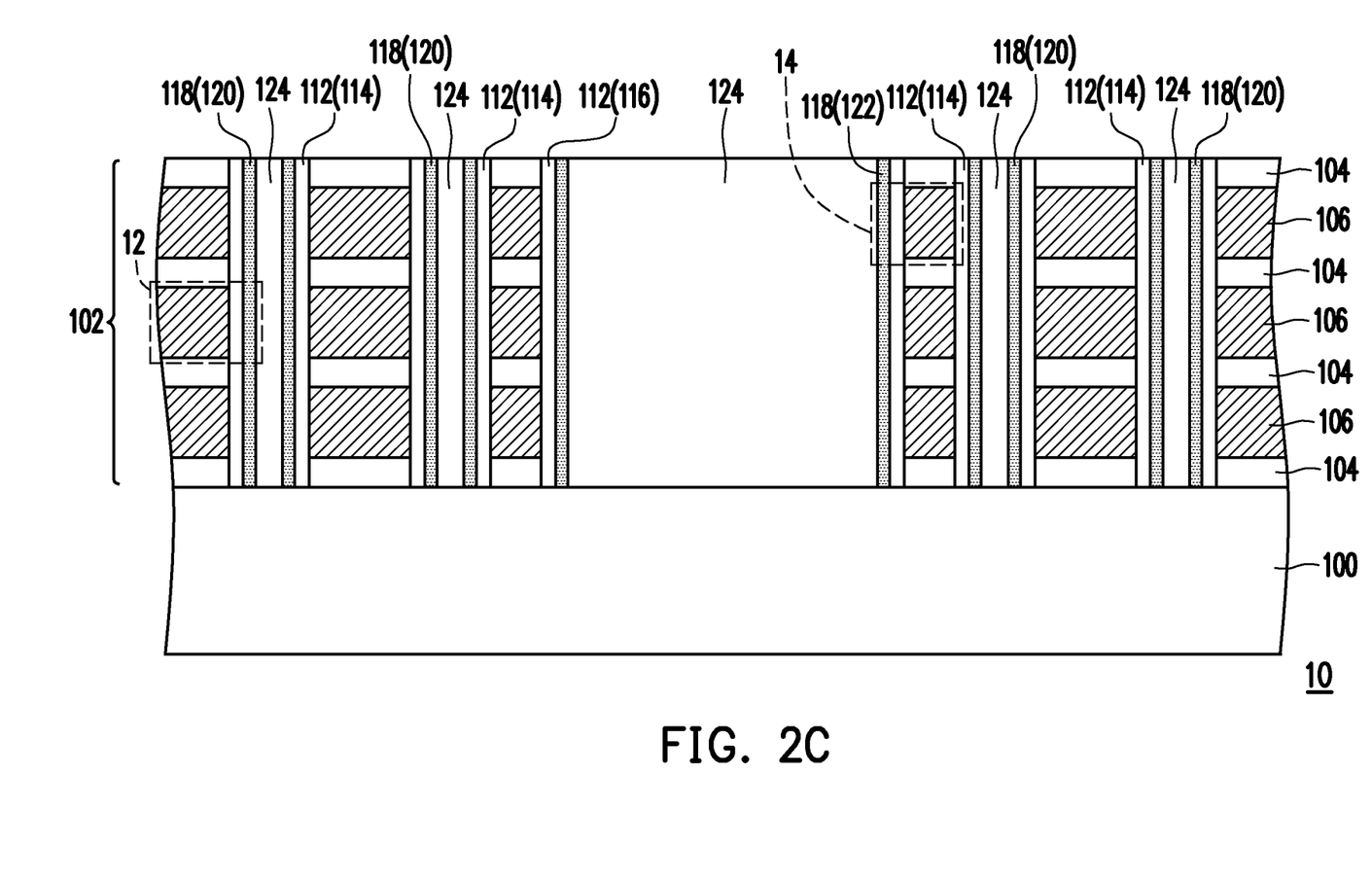

FIGS. 1A to 1C are schematic top views of a manufacturing process of a 3D memory device according to an embodiment of the present invention. FIGS. 2A to 2C are schematic cross-sectional views of the manufacturing process of the 3D memory device according to the A-A section line in FIGS. 1A to 1C.

Referring to FIGS. 1A and 2A, a gate stacked structure 102 is formed on a substrate 100. In the present embodiment, the substrate 100 is, for example, a silicon substrate, but the invention is not limited thereto. In other embodiments, the substrate 100 may be a dielectric substrate in which a conductive structure is formed. In the present embodiment, the gate stacked structure 102 is composed of insulating layers 104 and gate layers 106 that are alternately stacked on the substrate 100 in sequence. In addition, in the present embodiment, the top layer of the gate stacked structure 102 is the insulating layer 104. The insulating layer 104 is, for example, a silicon oxide layer. The gate layer 106 is, for example, a polysilicon layer or a metal layer. In the present embodiment, the gate stacked structure 102 includes four insulating layers 104 and three gate layers 106, but the invention is not limited thereto. In other embodiments, more layers of insulating layer 104 and more layers of gate layer 106 may be formed according to actual needs.

Referring to FIGS. 1B and 2B, channel holes 108 and a capacitor trench 110 are formed in the gate stacked structure 102. A part of the substrate 100 is exposed by the channel holes 108 and the capacitor trench 110. In the present embodiment, the top surface of the substrate 100 is exposed by the channel holes 108 and the capacitor trench 110, but the invention is not limited thereto. In other embodiments, the bottom of the channel holes 108 and the bottom of the capacitor trench 110 may be located in the substrate 100. In addition, in the present embodiment, when viewed from the top view above the substrate 100, each of the channel holes 108 has a square profile, and the capacitor trench 110 has a rectangular profile, but the present invention is not limited thereto. In other embodiments, the channel holes 108 and the capacitor trench 110 may have profiles of other shapes, such as a circle, an ellipse, or other types of polygons, when viewed from the top view above the substrate 100.

Figure 3A:
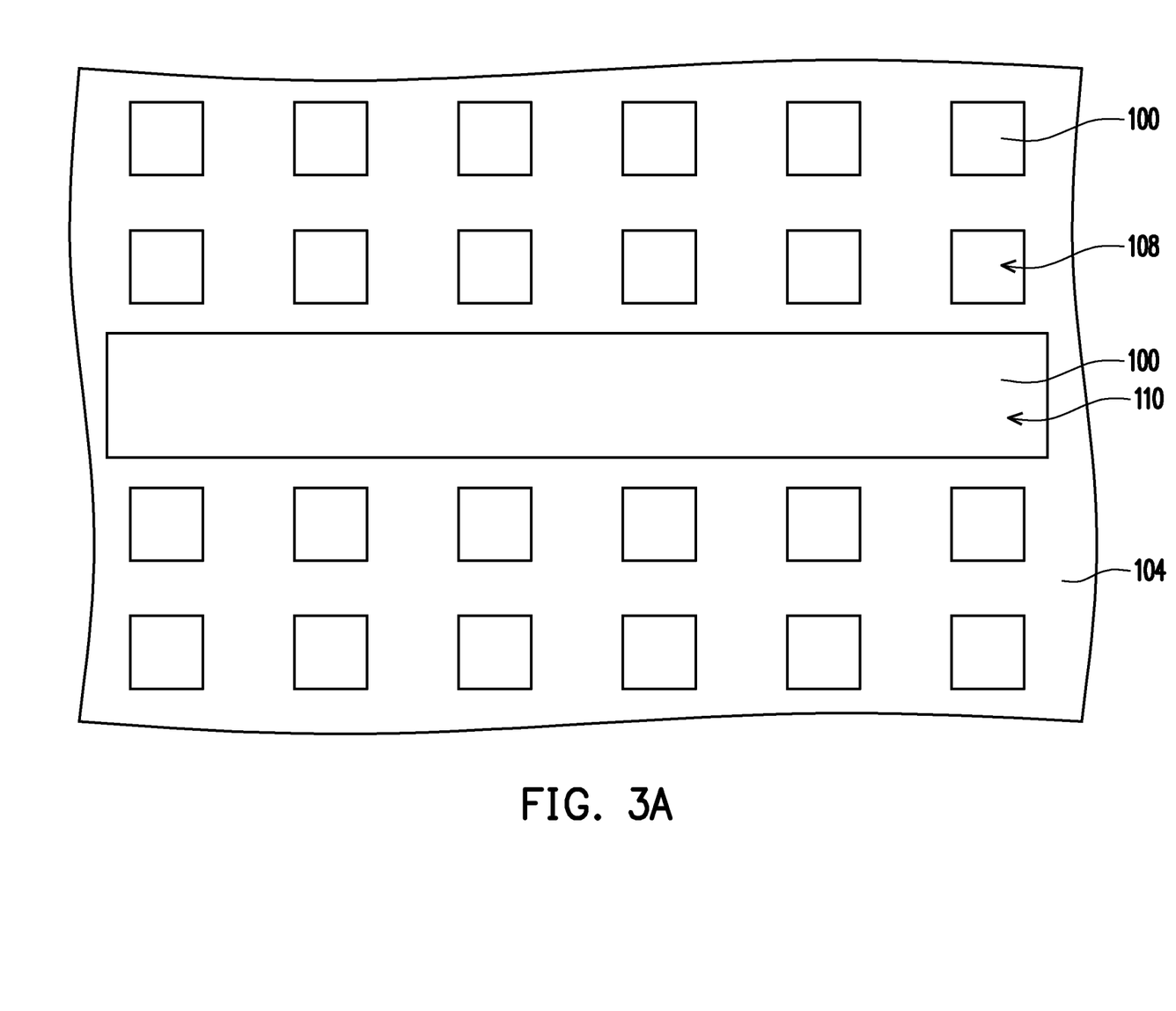
FIG. 3A is a schematic top view of channel holes and a capacitor trench in a memory device according to another embodiment of the present invention.
Figure 3B:
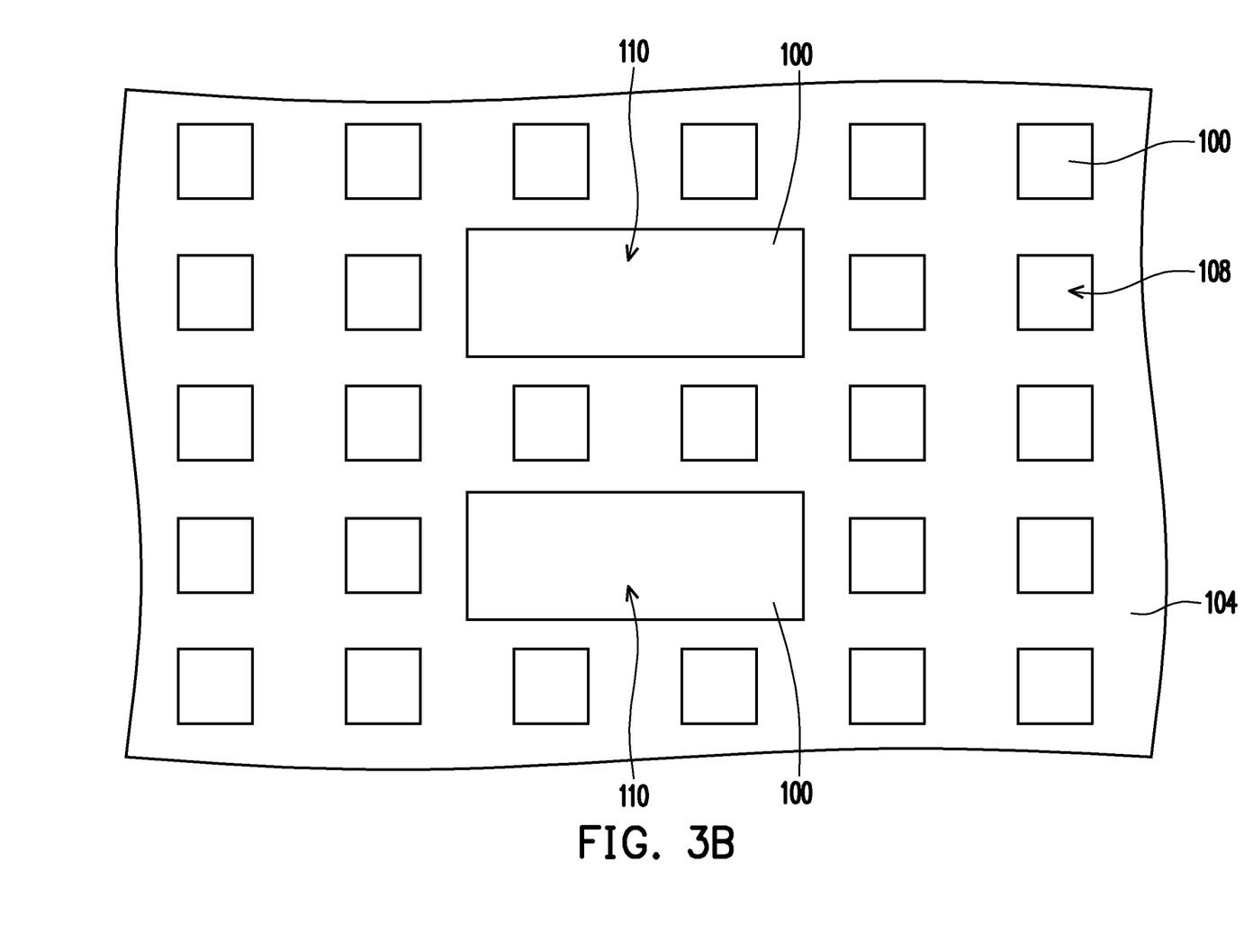
FIG. 3B is a schematic top view of channel holes and capacitor trenches in a memory device according to another embodiment of the present invention.

In the present embodiment, a method for forming the channel holes 108 and the capacitor trench 110 is, for example, to perform an anisotropic etching process on the gate stacked structure 102. The details of the anisotropic etching process are well known to those skilled in the art, and will not be further described here. That is, in the present embodiment, the channel holes 108 and the capacitor trench 110 are formed in the same anisotropic etching process, and the channel holes 108 and the capacitor trench 110 have the same depth. In the present embodiment, the channel holes 108 are arranged in an array and surround the capacitor trench 110. However, the present invention does not limit the number and arrangement of the channel holes 108 and the capacitor trench 110. For example, as shown in FIG. 3A, the channel holes 108 are arranged in an array and are located on the upper and lower sides of the capacitor trench 110. Alternatively, as shown in FIG. 3B, the channel holes 108 are arranged in an array and surround two capacitor trenches 110. According to actual needs, those skilled in the art may arbitrarily adjust the arrangement of the channel holes 108 and the capacitor trench(es) 110.

The channel holes 108 are used to form the channel regions of the 3D memory device of the present embodiment, and the capacitor trench 110 is used to form the capacitor of the 3D memory device of the present embodiment, which will be described later. In the present embodiment, the channel holes 108 and the capacitor trench 110 have significantly different sizes. The size of the capacitor trench 110 is significantly larger than the size of each of the channel holes 108. For example, when viewed from the top view above the substrate 100, the circumference of the opening of the capacitor trench 110 is at least 34 times the circumference of the opening of each of the channel holes 108. In this way, the size of the capacitor trench 110 is sufficient to form the capacitor of the 3D memory device of the present embodiment. In addition, the size of the capacitor trench 110 depends on the capacitance value required by the 3D memory device, which is not limited in the present invention.

Referring to FIGS. 1B and 2B, a first material layer 112 is formed on the sidewall of the channel holes 108 and the sidewall of the capacitor trench 110. A method for forming the first material layer 112 is, for example, to form a material layer conformally on the substrate 100, and then perform an anisotropic etching process to remove the material on the top surface of the gate stacked structure 102, on the bottom of the channel holes 108 and on the bottom of capacitor trench 110. The first material layer 112 on the sidewall of the channel holes 108 may be used as a charge storage structure 114 of a memory cell in the 3D memory device of the embodiment of the present invention, and the first material layer 112 on the sidewall of the capacitor trench 110 may be used as the capacitor dielectric layer 116 of a capacitor in the 3D memory device of the embodiment of the invention. That is, in the present embodiment, the charge storage structure 114 and the capacitor dielectric layer 116 are formed in the same process step, and the charge storage structure 114 and the capacitor dielectric layer 116 have the same material. In the present embodiment, the first material layer 112 is, for example, a composite layer composed of oxide layer/nitride layer/oxide layer, that is, the well-known ONO insulating layer, but the present invention is not limited thereto. In other embodiments, the first material layer 112 may also be a single material layer or a composite material layer suitable as a charge storage structure and a capacitor dielectric layer, such as a nitride layer.

After forming the first material layer 112, a second material layer 118 is formed on the first material layer 112. A method for forming the second material layer 118 is, for example, to form a material layer conformally on the substrate 100, and then perform an anisotropic etching process to remove the material layer on the top surface of the gate stacked structure 102, on the bottom of the channel holes 108 and on the bottom of capacitor trench 110. The second material layer 118 located on the charge storage structure 114 in the channel holes 108 may be used as a channel layer 120 of the memory cell in the 3D memory device of the embodiment of the present invention, and the second material layer 118 located on the capacitor dielectric layer 116 in the capacitor trench 110 may be used as an electrode layer 122 of a capacitor in the 3D memory device of the embodiment of the present invention. In other words, in the present embodiment, the channel layer 120 and the electrode layer 122 are formed in the same process step, and the channel layer 120 and the electrode layer 122 have the same material. In the present embodiment, the second material layer 118 is, for example, a polysilicon layer, but the invention is not limited thereto. In other embodiments, the second material layer 118 may also be another material layer suitable for use as a channel layer and an electrode layer.

Referring to FIGS. 1C and 2C, after forming the second material layer 118, an insulating layer 124 is formed to fill the channel holes 108 and the capacitor trench 110. In the present embodiment, the insulating layer 124 fills the channel holes 108 and the capacitor trench 110, that is, the top surface of the insulating layer 124, the top surface of the gate stacked structure 102, the top surface of the charge storage structure 114 and the top surface of the capacitor dielectric layer 116, the top surface of the channel layer 120 and the top surface of the electrode layer 122 are coplanar, but the present invention is not limited thereto. In this way, a 3D memory device 10 of the embodiment of the present invention is completed.

The 3D memory device 10 of the embodiment of the present invention includes the gate stacked structure 102, the charge storage structure 114, the channel layer 120, the capacitor dielectric layer 116 and the electrode layer 122. The gate stacked structure 102 includes the gate layer 106 stacked upward from the surface of the substrate 100, and the insulating layer 104 is disposed between the adjacent gate layers 106 to electrically insulate the adjacent gate layers 106 from each other.

The charge storage structure 114 is disposed on the sidewall of the channel holes 108 in the gate stacked structure 102, and the channel layer 120 is disposed on the charge storage structure 114. In this way, a plurality of memory cells 12 are formed on the sidewall of the channel holes 108, and the memory cells 12 are stacked upward from the surface of the substrate 100 along the depth extension direction of the channel holes 108. Each of the memory cells 12 includes a gate layer 106, a channel layer 120 and a charge storage structure 114 disposed between the gate layer 106 and the channel layer 120.

The capacitor dielectric layer 116 is disposed on the sidewall of the capacitor trench 110 in the gate stacked structure 102, and the electrode layer 122 is disposed on the capacitor dielectric layer 116. In this way, a plurality of capacitors 14 are formed on the sidewall of the capacitor trench 110, and the capacitors 14 are stacked upward from the surface of the substrate 100 along the depth extension direction of the capacitor trench 110. Each of the capacitors 14 includes a gate layer 106, an electrode layer 122 and a capacitor dielectric layer 116 disposed between the gate layer 106 and the electrode layer 122, wherein the gate layer 106 and the electrode layer 122 serve as two electrodes disposed opposite to each other in the capacitor 14.

In addition, in other process steps, other devices such as bit lines and source lines may be formed. For example, a bit line electrically connected to the upper end of the channel layer 120 and a source line electrically connected to the lower end of the channel layer 120 may be formed. By applying voltage to the bit line and the source line, the memory cell 12 disposed at the sidewall of the channel holes 108 may be operated. In addition, circuit patterns respectively connected to the gate layer 106 and the electrode layer 122 of the capacitor 14 may be formed, such that the capacitor 14 may be applied voltage to store charges. The detailed structure and process steps of the lines, source lines and circuit patterns connecting capacitor 14 are well known to those skilled in the art, and will not be further described here.

In the 3D memory device 10 of the present embodiment, the capacitor 14 is disposed in the gate stacked structure 102, that is, the capacitor 14 is disposed in the memory array region instead of in the peripheral region. Therefore, the layout area of the 3D memory device may be effectively reduced, thereby reducing the size of the 3D memory device.

In addition, in the 3D memory device 10 of the present embodiment, a plurality of capacitors 14 are stacked upward from the surface of the substrate 100 along the depth extension direction of the capacitor trench 110. In this way, the capacitance value may be further increased without increasing the layout area.

In the foregoing embodiment, the insulating layer 104 and the electrode layer 106 are directly stacked and formed on the substrate 100, but the present invention is not limited thereto. In other embodiments, an insulating stack structure composed of two different kinds of insulating layers may be formed on the substrate 100, and then one kind of the insulating layers may be replaced with the electrode layer. The replacement process is well known to those skilled in the art, and will not be further described here.

It will be apparent to those skilled in the art that various modifications and variations can be made to the disclosed embodiments without departing from the scope or spirit of the disclosure. In view of the foregoing, it is intended that the disclosure covers modifications and variations disposed that they fall within the scope of the following claims and their equivalents.

What is claimed is:

1. A three dimensional memory device, comprising:
 a gate stacked structure, disposed on a substrate and comprising a plurality of gate layers electrically insulated from each other, wherein the gate stacked structure has at least one channel hole and at least one capacitor trench;
 a channel layer, disposed on the sidewall of the at least one channel hole;

a charge storage structure, disposed between the channel layer and the sidewall of the at least one channel hole;

an electrode layer, disposed on the sidewall of the at least one capacitor trench; and a capacitor dielectric layer, disposed between the electrode layer and the sidewall of the at least one capacitor trench.

2. The three dimensional memory device of claim 1, wherein a circumference of an opening of the capacitor trench is at least 34 times a circumference of an opening of the channel hole when viewed from a top view above the substrate.

3. The three dimensional memory device of claim 1, wherein the material of the channel layer is the same as the material of the electrode layer.

4. The three dimensional memory device of claim 3, wherein the channel layer and the electrode layer comprise polysilicon layers.

5. The three dimensional memory device of claim 1, wherein the material of the charge storage structure is the same as the material of the capacitor dielectric layer.

6. The three dimensional memory device of claim 5, wherein the charge storage structure and the capacitor dielectric layer comprise a composite layer composed of oxide layer/nitride layer/oxide layer.

7. The three dimensional memory device of claim 1, wherein one end of the channel layer is electrically connected to a bit line, and the other end of the channel layer is electrically connected to a source line.

8. The three dimensional memory device of claim 1, wherein the gate stacked structure has a plurality of the channel holes, and the channel holes surround the at least one capacitor trench.

9. The three dimensional memory device of claim 1, further comprises an insulating layer filling the at least one channel hole and the at least one capacitor trench.

\* \* \* \* \*